April 21, 1964 W. F. DIETZ 3,130,264

TUNING SYSTEM

Filed Feb. 23, 1962

2 Sheets-Sheet 1

INVENTOR.

WOLFGANG F. DIETZ

BY Eugene M. Whitacre

Attorney

INVENTOR.
WOLFGANG F. DIETZ
BY Eugene M. Whitacre
Attorney 3,130,264

TUNING SYSTEM

Wolfgang F. Dietz, Franklin Park, N.J., assignor to Radio Corporation of America, a corporation of Delaware Filed Feb. 23, 1962, Ser. No. 175,031
12 Claims. (Cl. 178—5.8)

This invention relates to tuning systems and more particularly to signal-seeking tuning systems for television receivers.

Signal-seeking or lock-on-carrier tuning systems have been proposed heretofore for very high frequency (VHF) television receivers. One type of system which has been proposed utilizes a driving device, such as a motor, to drive the tuning elements in the receiver through the frequency spectrum, a signal sensing circuit to detect the presence of a signal being received, and a control circuit to stop the motor so that the receiver tuning elements will be tuned to the received signals.

Tuning systems of this type are also particularly desirable for the ultra-high frequency (UHF) television band (470 mc.–890 mc.) because the comparatively large number of channels allocated to this band make switch type tuning mechanisms complicated. Furthermore, since most television receivers use separate UHF and VHF tuners, a signal-seeking system for UHF tuning can be easily integrated into an automatic tuning system for very high frequency (VHF) stations using simplified channel selecting control means.

Signal-seeking systems for UHF television receivers present problems not encountered in systems for tuning radio broadcast receivers. As presently used, AM or FM radio broadcast signals contain a single carrier and are properly tuned when the received carrier is at the center of the receiver passband. This may be conveniently sensed by deriving a control voltage which is a function of the amplitude of the signal output from the intermediate frequency (I-F) channel and utilizing the voltage when it is a maximum to stop the tuning drive motor at the correct tuning position.

The problem of deriving a control voltage is more difficult in television receivers. A television signal contains both picture and sound carriers and each carrier will produce an individual response in the I-F amplifier channel as the frequency spectrum is scanned. Thus, a signal seeking system for television receivers must be able to distinguish between the two carriers in order to stop the tuner at a position where the carriers are converted to intermediate frequencies which are properly positioned on the I-F amplifier bandpass characteristic to correctly tune the television receiver.

A signal seeking system for UHF television receivers must also be able to distinguish between a desired signal and its image. If the tuner stops on the image signal, a large portion of the television signal, when converted to intermediate frequencies, will fall outside of the I-F amplifier bandpass characteristic and therefore be lost. To understand this latter point, it is to be noted that a television signal is transmitted with the picture carrier at a lower frequency than the sound carrier. Since present day television receivers are designed so that the local oscillator frequency is higher than the television signal frequency by an amount equal to the intermediate frequency, the picture and sound carrier waves will be transposed when converted to intermediate frequencies and the resultant picture I-F carrier waves will be at a higher frequency than the sound I-F carrier waves. However, in a signal seeking system for television receivers if the local oscillator frequency locks in below the television signal frequency by an amount equal to the intermediate frequency, no transposition occurs. In this situation, the I-F carrier on which the signal seeking system locks may may be at the desired position on the I-F amplifier bandpass characteristic but the other I-F carrier will fall outside the bandpass characteristic and either the sound or picture will be lost.

Accordingly it is an object of this invention to provide an improved signal-seeking tuning system for television receivers.

It is another object of this invention to provide an improved signal-seeking or lock-on-carrier tuning system which distinguishes between picture and sound carriers in a composite television signal so as to properly tune in a desired television signal.

It is still another object of this invention to provide an improved signal-seeking or lock-on-carrier tuning system for television receivers which distinguishes between a desired television signal and its image.

It is a further object of this invention to provide an improved signal-seeking tuning system for television receivers which does not tune in the image of a desired signal.

In accordance with the invention, a signal seeking system for tuning television receivers, includes driving means coupled to drive the tuning mens to tune the receiver through the frequency spectrum, and control circuit means coupled to deenergize the driving means when the receiver is properly tuned to a desired television signal. First signal sensing circuit means are coupled to the intermediate frequency amplifier in the television receiver to determine when an I-F carrier is at one of the two predetermined frequencies for the sound and picture carriers. Second signal sensing circuit means are also coupled to the intermediate frequency amplifier to determine whether the other of said carrier signals is at the proper I-F frequency. To ascertain whether the receiver is properly tuned when there are carriers at both predetermined frequencies, third signal sensing circuit means are provided to identify the carrier at one of the two predetermined frequencies.

In one embodiment of the invention, the first signal sensing circuit means comprises a sharply tuned filter at the picture I-F carrier frequency, and the second signal sensing circuit may comprise the integrated output of the video amplifier to determine the direction of scanning of the carriers and hence the relative frequency of the other carrier, as will be explained. The third signal sensing circuit identifies which carrier is at the picture I-F carrier frequency by determining whether the carrier is frequency modulated or amplitude modulated. When the receiver is properly tuned a control signal is developed and applied to actuate the control circuit means to stop the tuning means.

The novel features that are considered to be characteristic of this invention are set forth with particularity in the appended claims. The invention itself, however, both as to its organization and method of operation, as well as additional objects and advantages thereof, will best be understood from the following description when read in conjunction with the accompanying drawing, in which:

Figure 1:
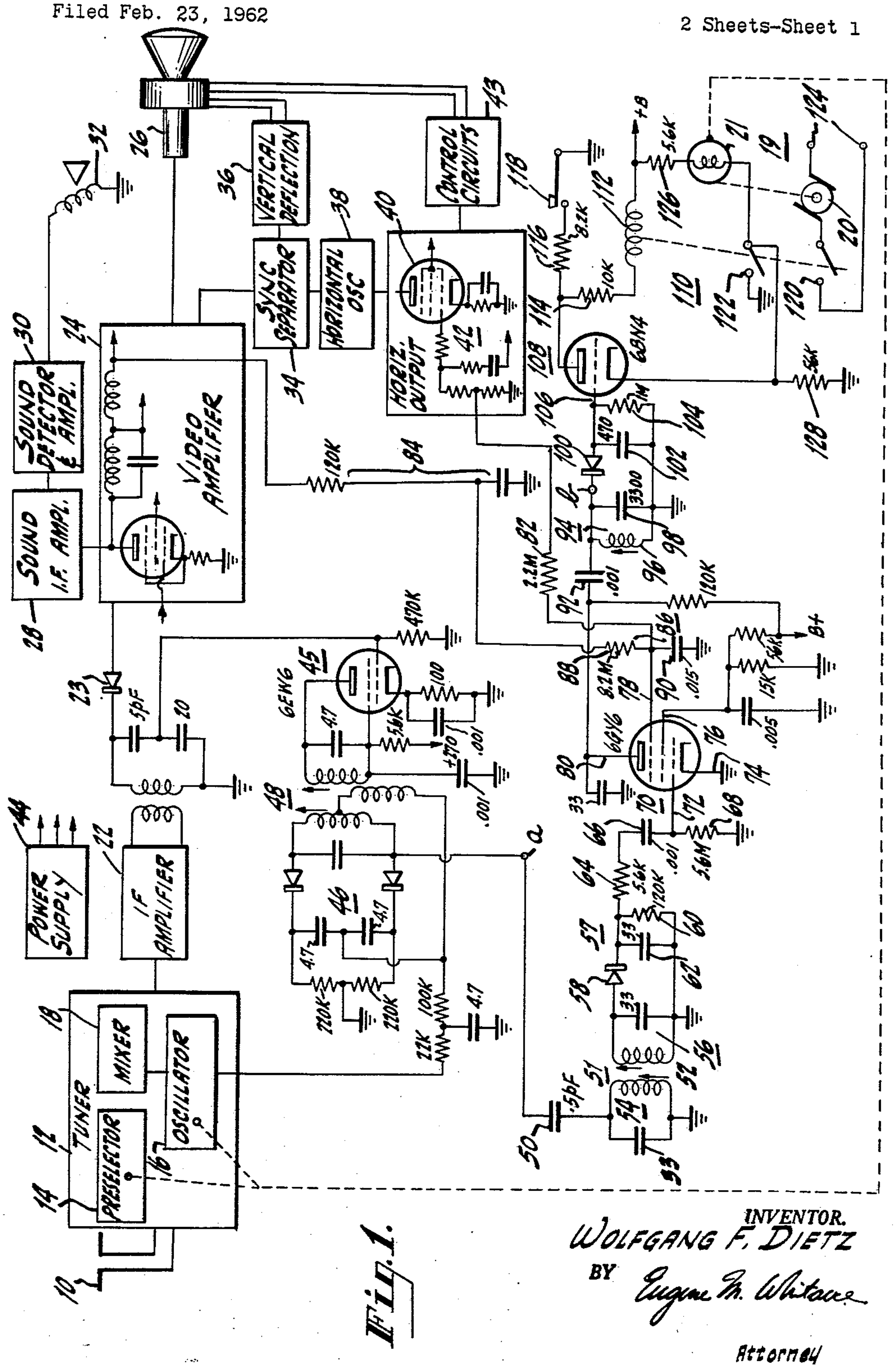
FIGURE 1 is a schematic circuit diagram, partly in block form, of a signal seeking tuning system in accordance with the invention.
Figures 3, 3A, 3B:
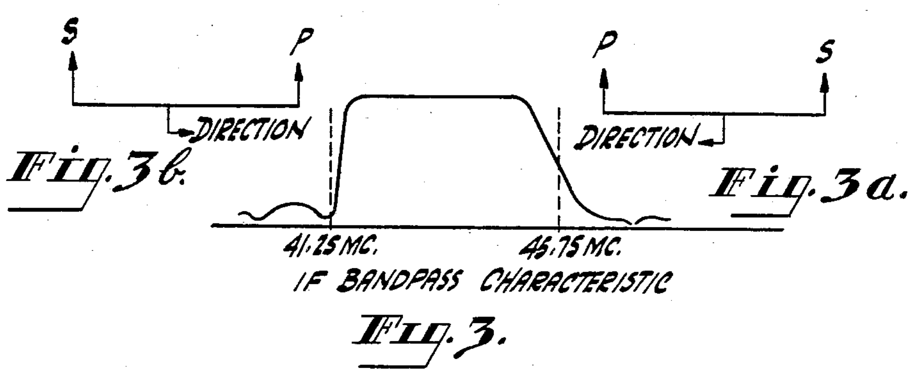
Figure 4:
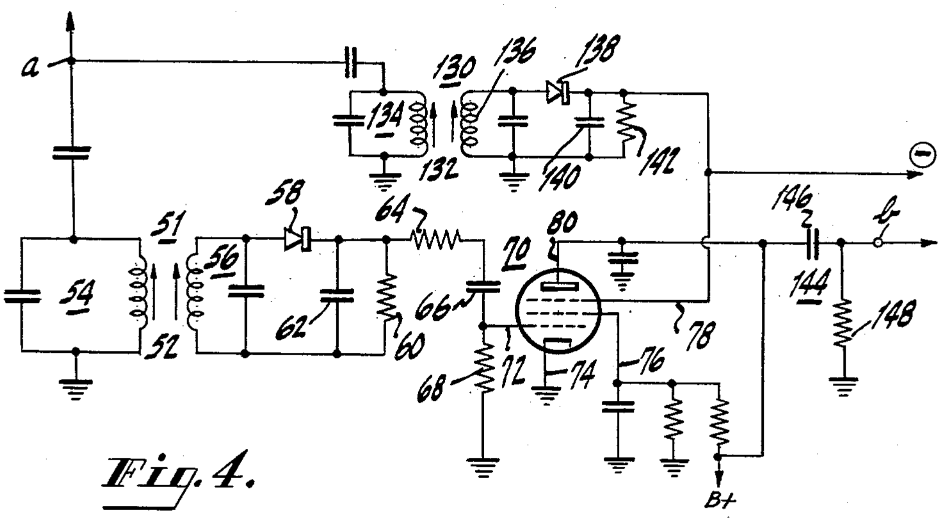

FIGURE 3 is a graph illustrating a typical television receiver intermediate frequency amplifier bandpass characteristic, while FIGURES 3A and 3B diagrammatically illustrate how an image and a desired television intermediate frequency signal respectively approach the bandpass characteristic of the I-F amplifier as the local oscillator is tuned over a range of frequencies; and, FIGURE 4 is a schematic circuit diagram of another embodiment of a portion of the signal seeking tuning system shown in FIGURE 1.

Referring now to the drawing, FIGURE 1 illustrates a television receiver which includes a signal seeking system in accordance with the invention. The television receiver shown by way of example comprises an RCA KCS-136 series chassis which is shown in the publication "Preliminary Television Service Data"—File: 1961 No. T4—prepared by the RCA Sales Corporation, 600 North Sherman Drive, Indianapolis, Indiana. The television receiver is coupled to an antenna 10 for intercepting television signals in the UHF band, which signals are applied to a tuner 12. The tuner 12 includes a resonant UHF preselector 14 and a local oscillator 16 for generating heterodyning waves. Both the preselector 14 and local oscillator 16 are coupled to a mixer circuit 18 which mixes the received television signal and local oscillatory waves to provide a correspondingly modulated signal of an intermediate frequency. Both the preselector 14 and oscillator 16 include continuously variable tuning elements which are ganged for movement together and coupled to be driven by driving means 19, which is shown as comprising a motor 20 and an electromagnetic clutch 21.

The intermediate frequency signal is amplified in an intermediate frequency amplifier 22 and detected in a video detector 23. The composite video signal output from the detector 23 includes a video signal which is amplified by a video amplifier 24 and applied to a picture tube 26.

An intercarrier sound signal, produced by the interaction of the picture and sound intermediate frequency signals in the video detector 23, is also amplified in the video amplifier 24 and then applied to a sound intermediate frequency amplifier 28. The amplifier 28 is tuned to the 4.5 megacycle frequency of the intercarrier sound signal, which is the fixed frequency separating the picture carrier from the sound carrier in a typical transmitted television signal. The amplified sound I-F output from the amplifier 28 is detected and amplified in a sound detector and audio amplifier stage 30 before application to a loudspeaker 32.

The composite video signal is also applied from the video amplifier 24 to a synchronizing signal separator 34. The separator 34 separates the vertical synchronizing pulses and applies them to vertical deflection control circuits 36 to control the vertical deflection of the cathode ray beam in the picture tube 26. The separator 34 also separates and applies the separated horizontal synchronizing pulses to a horizontal oscillator 38 which is coupled to a horizontal output tube 40 having a control grid circuit 42. A relatively large negative voltage is developed at the control grid circuit 42 which is utilized in a manner to be described subsequently. The horizontal output tube 40 drives a control circuit 43 which controls the horizontal deflection of the cathode ray beam in the picture tube 26. As is known, the oscillating and other voltages are also generated in the control circuit 43. The various stages of the television receiver are suitably connected to a power supply circuit 44, by connections not shown.

The circuits which have been described thus far are known circuits utilized in present day commercial television receivers.

A portion of the composite video signal appearing at the output of the intermediate frequency amplifier 22 is amplified in an amplifier 45 and applied to a frequency discriminator 46. The discriminator 46 includes a transformer 48 having both the primary and secondary windings thereof tuned to 45.75 megacycles, which is the predetermined proper intermediate frequency of the picture carrier signal in present day U.S. receivers. The discriminator 46 may be of any suitable configuration to provide an automatic frequency control for the local oscillator 16. As such, the direct voltage obtained when the input signal frequency varies from 45.75 megacycles may be applied to reverse bias a variable-capacitance diode or the like, not shown, which may be included in the local oscillator 16 frequency determining circuit to control the frequency of oscillation.

The tuned secondary of the transformer 48 is coupled from a terminal "*a*" through a capacitor 50 to a first signal sensing circuit which includes a filter circuit 51 sharply tuned to one of the predetermined picture and sound intermediate frequency carrier signals. The circuit 51 in this embodiment of the invention is tuned to the intermediate frequency of the picture carrier at 45.75 mc. and includes a transformer 52 having a tuned primary circuit 54 as well as a tuned secondary circuit 56 loosely coupled to the primary circuit 54. The filter circuit 51 exhibits a bandwidth of approximately 300 kilocycles.

The output of the filter circuit 51 is connected to a peak detecting circuit 57. The circuit 57 includes a diode 58 which has its anode coupled to one terminal of the secondary circuit 56 and its cathode coupled through the parallel combination of a resistor 60 and a capacitor 62 to the other terminal of the secondary circuit 56. The rectified output of the diode 58 is applied through an isolating resistor 64 to the series combination of a capacitor 66 and a resistor 68. The junction of the capacitor 66 and resistor 68 is coupled to the input electrode of a pentode gate tube 70. The peak detecting circuit 57 comprises a synchronizing signal amplitude-separator circuit whose function will be described below.

The pentode tube 70 in addition to the input electrode or grid 72 also includes a grounded cathode 74, a positively biased screen grid 76, a negatively biased suppressor grid 78, as well as a plate 80. The suppressor grid 78 is coupled through a resistor 82 to the control grid circuit 42 of the horizontal output tube 40 where a relatively large negative voltage is developed. The negative voltage is of sufficient amplitude to maintain the tube 70 substantially non-conductive. The suppressor grid 78 is also coupled to the output circuit of the video amplifier 24 through a filter 84 and a gate control integrating circuit 86 comprising a resistor 88 and a capacitor 90. The integrating circuit 86 comprises a second signal sensing circuit to determine the relative frequency of the second carrier signal. With this connection, a positive voltage from the video amplifier 24 is superimposed on the negative bias voltage at the suppressor grid 78 when a sound or picture intermediate frequency carrier is of a frequency to fall within the pass band of the I-F amplifier 22. The resultant positive voltage is of sufficient amplitude to overcome the negative voltage applied to the suppressor grid from horizontal output tube 40 and thereby permit conduction of the tube 70.

The plate or output electrode 80 of the gate 70 is coupled through a capacitor 92 to a modulation detecting or third signal sensing circuit 94 which includes the parallel combination of an inductor 96 and a capacitor 98. The circuit 94 is tuned to 15.750 kilocycles frequency, the frequency of the horizontal synchronizing signal pulses contained in the I-F picture carrier signals.

A rectifying circuit, having an input terminal "*b*" includes a rectifier 100 connected in series with the parallel combination of a capacitor 102 and a resistor 104. The rectifying circuit is coupled across the resonant circuit 94 in a manner to rectify the horizontal synchronizing signal modulation developed therein and apply a negative control voltage to the control grid 106 of a tube 108. The tube 108 comprises the active element in control circuit means which includes a relay 110. The relay 110 includes a coil 112 which is coupled between B+ and ground through a pair of resistors 114 and 116 and an energizing or search switch 118. The energizing switch 118 is shown in FIGURE 1 as manually operated and, as such, should be conveniently mounted on the television receiver cabinet for easy access by a viewer. However the switch 118 may also comprise the output relay contacts of a remote control receiver in a remotely controlled signal seeking tuning system (not shown), which contacts may be actuated by a control signal caused to be transmitted by a viewer.

The relay 110 also includes a dual pair of normally-open contacts 120 and 122 which are actuated when the relay coil 112 is energized by the closing of the energizing switch 118. The relay contacts 120, when actuated to close, energize the motor 20 by connecting it directly across a pair of A.C. supply line terminals 124. The relay contacts 122, when closed, energize the electromagnetic clutch 21. The clutch 21 is permanently connected between B+ and ground through a pair of resistors 126 and 128, the resistance value of which is selected to be sufficiently great to hold the current through the clutch 21 below the threshold energizing current thereof. When the contacts 122 close, the resistor 128 is shorted out to permit sufficient current to flow through the clutch 21 to energize it and thereby couple the motor 20 to drive the tuning elements of the oscillator 16 and preselector 14.

The closing of the relay contacts 122 also causes the relay control tube 108 to conduct. The tube 108 is held non-conductive prior to this closing by connecting the plate thereof through the resistor 114 and the relay coil 112 to B+ potential while the cathode is held nearly at B+ potential by connecting it to the ungrounded terminal of the resistor 128. The shorting out of the resistor 128 by the relay contacts 122 grounds the cathode of the relay tube 108 which causes the tube to conduct.

In operation, a viewer wishing to tune in a television signal would momentarily close the initiating or energizing switch 118. The closing of the switch 118 energizes the relay coil 112 by placing the coil in a conductive path between B+ and ground. The energization of the relay coil 112 closes the relay contacts 120 and 122, thereby activating the motor 20 and the electromagnetic clutch 21 respectively. The clutch 21 is pulled against the drive shaft of the motor 20 and is driven thereby. The closing of the relay contacts 122 also causes the relay control tube 108 to conduct. The viewer may then open the switch 118 and the tube 108 will remain conductive and keep the relay winding 110 energized.

Figure 2:
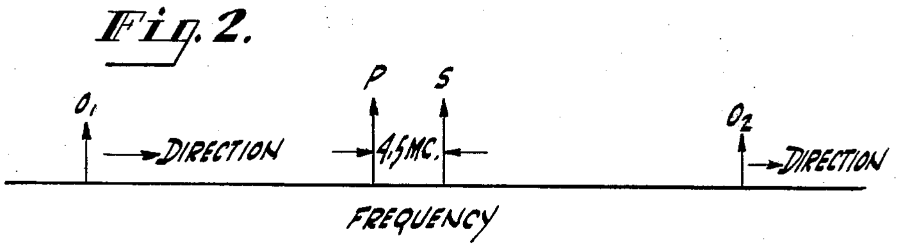
FIGURE 2 is a graph illustrating the positioning of the picture and sound carrier signals relative to a local oscillator signal, as the local oscillator is tuned over a range of frequencies.

The tuning elements in the tuner 12 are driven by the driving means 19 to scan the frequency spectrum. Referring to FIGURE 2, a desired television signal, shown as "P" and "S," which represent the picture and sound carrier frequencies respectively, is transmitted with the picture carrier frequency spaced a fixed 4.5 megacycles below the sound carrier frequency. As the local oscillator 16 is driven from low to high frequencies, the oscillator frequency will reach a value, such as $O_1$ in FIGURE 2, where image signal responses occur in the receiver. The local oscillator frequency in the position $O_1$ is located below the frequency of the desired television signal (P—S) by an amount approaching the intermediate frequency of one of the picture or sound carrier signals.

The different directions from which the I-F signals approach the bandpass characteristic of the I-F amplifier 22 when the local oscillator frequency is first below, and second above, the television signal frequency band enables the signal seeking system to distinguish between a desired television signal and its image. As shown in FIGURE 3, the picture and sound I-F signals (FIGURE 3A) will be decreasing in frequency and approach the upper frequency extremity of the I-F amplifier bandpass characteristic when the local oscillator frequency is increasing in frequency but below the television signal band. Thus the picture image I-F signal will reach the I-F amplifier 22 bandpass characteristic first. The I-F amplifier 22 will amplify this image signal and the video amplifier 24 will start developing a control voltage in the second signal sensing circuit 86. When the picture image I-F signal reaches the first predetermined frequency of 45.75 megacycles, an amplified portion of this signal will be passed through the first signal sensing circuit 51 and applied to the gate 70. The gate 70 will however be non-conductive because the time constant of the integrating circuit 86 is selected to be sufficiently long to prevent the development of a positive control voltage of a sufficient magnitude to overcome the negative bias voltage on the control electrode 78 during the short time it takes for the picture image I-F signal to reach 45.75 megacycles from the upper extremity of the I-F amplifier bandpass characteristic.

Thus the gate 70 is not made conductive, and the driving means is not stopped at the image signal. Otherwise, the picture image I-F signal would possibly lock on frequency to produce a degraded picture in the picture tube 26 but the sound I-F signal would fall outside the bandpass of the I-F amplifier 22 and no sound would be heard. Thus it is important in a signal seeking tuning system to be able to properly distinguish between a desired television signal and its image.

Since the driving means 19 is not stopped as noted above, the local oscillator 16 is tuned further and the sound image I-F signal will reach the first predetermined frequency of 45.75 megacycles to which the resonant circuit 51 is tuned. The gate 70 will now be conductive since the integrating circuit 86 will have developed enough of a positive control voltage to overcome the negative voltage on the control electrode 78 due to the picture I-F image signal traversing the amplifier 22 bandpass characteristic. Thus the sound image I-F signal will pass through both the first signal sensing circuit 51 and the gate 70. However inasmuch as the modulation detecting circuit 94 is tuned to the 15.750 kilocycles frequency of the horizontal synchronizing signal pulses, the sound I-F carrier does not provide a sufficient output at this frequency to cause a voltage to be developed across the circuit 94. Thus the tube 94 is not cut off to stop the tuning elements at this position.

With the sound image I-F signal at the first predetermined frequency of 45.75 megacycles, the picture I-F image signal will be at the second predetermined frequency of 41.25 megacycles, due to the fixed 4.5 megacycle frequency difference between these signals. However no synchronizing signal modulation in the picture I-F image signal will pass through the gate 70 because the first signal sensing circuit 51 is sharply tuned to 45.75 megacycles and exhibits a narrow bandwidth, on the order of 300 kilocycles. Thus the picture image I-F signal at 41.25 megacycles is well beyond the passband of the first signal sensing circuit 51, which eliminates the possibility that the sync signal modulation contained in the signal will actuate the motor control circuit means to deenergize the driving means 19. Additionally it is to be noted that when the picture image I-F signal is at 41.25 megacycles, it is located on a portion of the I-F amplifier 22 bandpass characteristic where it is severely attenuated. Thus a further guarantee against undesirable actuation is thereby provided.

As the local oscillator 16 is tuned through the frequency spectrum to higher frequencies, the local oscillator frequency will approach a value, shown as $O_2$ in FIGURE 2, which is the desired local oscillator frequency to correctly tune in the television signal. Since the local oscillator frequency is now higher than the television signal frequency band, the desired picture I-F signal will be increasing in frequency and approach the bandpass characteristic of the I-F amplifier 22 toward the direction of the lower frequency extremity thereof, as shown in FIGURE 3B. The picture I-F signal will start producing a control voltage in the integrating circuit 86 when it is at the lower frequency extremity of the I-F amplifier 22 bandpass characteristic and will traverse the major portion of this bandpass characteristic before it reaches the first predetermined frequency of 45.75 megacycles. During the time it takes for the picture I-F signal to reach 45.75 megacycles the integrating circuit 86 will have developed a sufficiently large positive voltage from the output of the video amplifier 24 to render the gate 70 conductive. When the picture I-F carrier signal reaches the first predetermined frequency of 45.75 megacycles, the sound I-F carrier signal will have reached the second predetermined frequency of 41.25 megacycles because these signals are spaced a fixed 4.5 megacycles apart. These are the correct intermediate frequencies for both the picture and sound carriers to provide a properly tuned in television signal.

The first resonant circuit 51 and gate 70 will now pass a portion of the frequency spectrum of the picture I-F signal through to the modulation detecting circuit 94. The circuit 94 is tuned to the frequency of the horizontal sync signal modulation contained in the picture I-F signal. The sync signals thus develop a voltage across the circuit 94, and are rectified in the rectifier 100 to develop a control signal of a negative polarity which is applied to the control grid 106 of the relay tube 108, to cut off this tube. Cutting off the tube 108 deenergizes the relay coil 112 which opens the relay contacts 120 and 122 and deenergizes both the motor 20 and clutch 21. The deenergization of the clutch 21 moves the clutch away from the drive shaft of the motor 20 and stops the tuning elements abruptly. Thus, even though the inertia inherent in the motor 20 might rotate the drive shaft thereof beyond the desired stopping position, the tuning elements in the tuner 12 will not be affected. Additionally the automatic frequency control circuit 46 will correct for any slight mistuning in the local oscillator frequency.

Thus, a tuning system of the signal-seeking type is provided which properly tunes in a desired television signal while rejecting image signals.

The peak detecting circuit 57 is designed to function as a synchronizing signal amplitude separator. Since the base of the synchronizing pulses is at a fixed level in the transmitted television signal envelope and does not depend on the picture information in the television signal, a relatively fixed biasing voltage may be obtained therefrom. The capacitor 66 in the peak detecting circuit 57 charges up to the synchronizing pulse peak level and drives the input electrode 72 of the gate 70 positive. During the interval between successive synchronizing pulses, the capacitor 66 discharges through the resistor 68 in a direction to drive the input electrode 72 of the gate 70 negative. The discharge time constant is selected to be sufficiently long to maintain the input electrode 72 negative between the successive synchronizing pulses. Each successive pulse will however drive the electrode 72 positive and the electrode 72 is therefore biased to conduction only on the peak excursions of the synchronizing pulses in the picture I-F signal.

It was found that accurate tuning of UHF stations can be effected when the driving means 19 was geared to drive the local oscillator 16 through the UHF band from 500 megacycles to 950 megacycles in approximately 5 seconds. The values of circuit components which were used in a circuit exhibiting good operational characteristics are illustrated in FIGURE 1 and the time constant of the integrating circuit 86 was selected to be approximately 25 milliseconds.

While the invention has been described with the first signal sensing circuit 51 tuned to the first predetermined picture intermediate frequency of 45.75 megacycles, it is of course apparent that this circuit could instead be tuned to the second predetermined sound intermediate frequency of 41.25 megacycles. In this case, the modulation detecting circuit 94 would be designed to respond to the frequency modulation contained in the sound I-F signal.

Referring now to FIGURE 4, wherein components similar to those used in FIGURE 1 have been given the same reference numerals, another embodiment of the invention is illustrated. Only so much of this embodiment is shown as required to show the difference between this embodiment and that of FIGURE 1. The major differences between this embodiment and that of FIGURE 1 is that different second signal sensing and modulation detecting circuits are illustrated.

A second signal sensing circuit 130, in accordance with the invention, includes a transformer 132 having a tuned primary circuit 134 and a tuned secondary circuit 136. The primary circuit 134 is coupled between ground and the terminal "*a*" which, as shown in FIGURE 1, is located in the secondary circuit of the automatic frequency control circuit transformer 48. The secondary circuit 136 is shunted by a rectifying circuit including a diode 138 and the parallel combination of a capacitor 140 and a resistor 142. The anode of the diode 138 is connected to one terminal of the secondary circuit 136 while the cathode of the diode 138 is coupled through the parallel combination of the capacitor 140 and resistor 142 to the other terminal of the secondary circuit 136, which in turn is grounded. The cathode of the diode 138 is also connected to the control electrode or suppressor grid 78 of the pentode gate 70 to apply a control voltage of a positive potential thereto.

The pentode gate 70 is biased to cut-off by applying a negative potential to the suppressor grid 78. The negative potential, shown diagrammatically, in this embodiment of the invention could also be derived from the horizontal output tube 40, as shown in FIGURE 1, but the bias should be relatively small because the positive control voltage developed in the signal sensing circuit 130 would be less than that derived from the video amplifier 24 in the embodiment shown in FIGURE 1.

The output electrode or plate 80 of the pentode gate 70 is coupled through a modulation detecting circuit 144 to the terminal "*b*" which, as shown in FIGURE 1, is the input terminal of the grid control circuit of the relay tube 108. The modulation detecting circuit 144 comprises a capacitor 146 and a resistor 148 which functions as a high pass filter.

In operation, the first signal sensing circuit 51 is sharply tuned to the first predetermined picture intermediate frequency of 45.75 megacycles, while the second signal sensing circuit 130 is sharply tuned to the second predetermined sound intermediate frequency of 41.25 megacycles. It is to be noted that while the AFC transformer 48 in FIGURE 1 is tuned to 45.75 megacycles, the bandwidth of this transformer is not selective enough to block all signals at the 41.25 megacycle frequency, even though such signals are attenuated.

The modulation detecting circuit 144 in this embodiment functions as a high pass filter to select the higher frequency modulation, such as the synchronizing signal modulation contained in picture I-F signals at 45.75 megacycles and rejects sound I-F signals which are converted to the same frequency because of the absence of such amplitude modulation. Thus the modulation detecting circuit 144 in this embodiment of the invention functions similarly to the circuit 94 in the embodiment shown in FIGURE 1.

Referring now to FIGURES 2 and 3 as well as FIGURE 4, the direction of approach to the I-F amplifier bandpass characteristic of a composite television signal, when converted by local oscillator heterodyning waves at a position such as $O_1$ in FIGURE 2, would be that illustrated in FIGURE 3A. The picture image I-F signal "P" would therefore first produce a response in the first signal sensing circuit 51 since this circuit is tuned to 45.75 megacycles. However the gate 70 would not be conductive because of the negative bias on the control electrode 78. Thus no output signal would be transmitted to the modulation detecting circuit 144 and the signal seeking system would not stop on the image signal. When the sound I-F signal "S" reaches the first predetermined frequency of 45.75 megacycles, the gate 70 will be conductive since the picture I-F signal "P" will now be at 41.25 megacycles due to the fixed 4.5 mc. frequency difference between these signals. Therefore a positive control voltage would be produced in the second signal sensing circuit 130 to overcome the negative bias on the control electrode 78. However, the modulation detecting circuit 144 will prevent the sound I-F signals at 45.75 megacycles, which are passed through the gate 70, from stopping the driving means 19 since no amplitude modulation will be contained in such signals. The sharply tuned resonant circuit 51 will also prevent any picture I-F signals at 41.25 megacycles from passing through the gate 70. Thus the tuning means will be driven past the image signal and the local oscillator 16 will arrive at a position $O_2$ in FIGURE 2 where the desired signal may be correctly tuned in.

When the local oscillator frequency approaches the position $O_2$, the picture and sound I-F carrier signals will approach the I-F amplifier bandpass characteristic as shown in FIGURE 3B. The picture I-F carrier signal "P" will produce a response in the second signal seeking circuit 130 when this signal reaches the second predetermined frequency of 41.25 megacycles. Thus the gate 70 will be rendered conductive. However the sharply tuned first signal sensing circuit 51 will block picture I-F signals at this frequency so no output signal will be obtained from the gate 70 to stop the driving means.

When the picture I-F carrier signal "P" reaches the desired frequency of 45.75 megacycles, the sound I-F carrier signal "S" will have reached the desired frequency of 41.25 because of the fixed 4.5 megacycle frequency difference between these two carriers. Thus the gate 70 will be rendered conductive by the control voltage developed in the second signal sensing circuit 130 and the gate 70 will pass signals developed in the first signal sensing circuit 51.

The amplitude modulation contained in the picture I-F carrier signal will develop a control voltage in the modulation detecting circuit 144 which deenergizes the driving means 19 to stop on this signal. Thus a signal seeking system which rejects image signals and properly tunes in a desired television signal is provided.

A similar analysis will show that tuning the local oscillator 16 from high to low frequencies will also produce similar results. Furthermore it is apparent that by selecting a modulation detecting circuit 144 which is responsive to the frequency modulation in sound I-F carrier signals, the first signal sensing circuit 51 could be tuned to 41.25 megacycles and the second signal sensing circuit 130 could be tuned to 45.75 megacycles without deviating from the scope of the invention.

What is claimed is:

1. A signal seeking system for tuning television receivers of the type including tuning means for scanning the frequency spectrum and selecting any one of a plurality of television signals and converting the modulated picture and sound carrier signals of a selected television signal to correspondingly modulated picture and sound intermediate frequency signals, and an intermediate frequency amplifier coupled to said tuning means and having a predetermined bandpass characteristic, said receiver being correctly tuned when said picture and sound carrier signals are respectively converted to intermediate frequency signals of first and second predetermined frequencies respectively both within said bandpass characteristic, comprising in combination:

driving means coupled to drive said tuning means to scan through the said frequency spectrum;

control circuit means coupled to deenergize said driving means to stop said tuning means when said control circuit means are actuated by a control signal;

first circuit means coupled to said intermediate frequency amplifier for sensing when one of said picture and sound I-F carrier signals is at one of said predetermined frequencies;

second circuit means coupled to said I-F amplifier for developing a control voltage whenever the other of said I-F carrier signals falls within said bandpass characteristic at the same time said one I-F carrier signal is at said one predetermined frequency;

gate circuit means coupled to said first and second circuit means and responsive to said control voltage developed in said second circuit means to pass said one I-F carrier signal; and means coupled between said gate circuit means and said control circuit means for developing a control signal when the type of modulation in said one I-F carrier signal applied thereto is indicative of the desired type of modulation for said one predetermined frequency whereby said control circuit means are actuated by said control signal to stop said tuning means at a desired television signal.

2. A signal seeking system for tuning television receivers of the type including tuning means for scanning the frequency spectrum and selecting any one of a plurality of television signals and converting the picture and sound carriers of said signal to correspondingly modulated picture and sound intermediate frequency signals, and an intermediate frequency amplifier coupled to said tuning means and having a predetermined bandpass characteristic, said receiver being correctly tuned when said picture and sound carrier signals are respectively converted to intermediate frequency signals of a first predetermined frequency and a second predetermined frequency both lying within said bandpass characteristic, comprising in combination:

driving means coupled to drive said tuning means to scan through the said frequency spectrum;

control circuit means coupled to stop said driving means when said control circuit means are actuated by a control signal;

first signal sensing circuit means coupled to said intermediate frequency amplifier for detecting when one of said picture and sound I-F carrier signals is at one of said predetermined frequencies;

second signal sensing circuit means coupled to said intermediate frequency amplifier for developing a control voltage when the other of said picture and sound I-F carrier signals is simultaneously at the other of said predetermined frequencies;

gate circuit means coupled to said first and second sensing circuit means for passing said one I-F carrier signal when a control voltage is developed in said second sensing circuit means; and modulation detecting means coupled between said gate circuit means and said control circuit means for developing a control signal when the type of modulation in said one I-F carrier signal is indicative of the desired type of modulation for signals at said one predetermined frequency; whereby said control circuit means are actuated by said control signal to stop said tuning means only when a desired television signal is being received.

3. A signal seeking system for tuning television receivers of the type including tuning means for scanning the frequency spectrum and selecting any one of a plurality of television signals and converting the modulated picture and sound carrier signals of said television signal to correspondingly modulated picture and sound intermediate frequency signals, and an intermediate frequency amplifier having a predetermined bandpass characteristic coupled to said tuning means for amplifying said intermediate frequency carrier signals, said receiver being correctly tuned when said picture and sound carrier signals are respectively converted to intermediate frequency carrier signals of a first predetermined frequency and a second predetermined frequency both lying within said bandpass characteristic, comprising in combination:

driving means coupled to drive said tuning means to scan through the said frequency spectrum;

control circuit means coupled to deenergize said driving means to stop said tuning means when said control circuit means are actuated by a control signal;

first signal sensing circuit means coupled to said intermediate frequency amplifier for determining when one of said I-F carrier signals is at said first predetermined frequency;

second signal sensing circuit means coupled to said intermediate frequency amplifier for determining when the other of said I-F carrier signals is at said second predetermined frequency; and third signal sensing circuit means responsive to said first and second circuit means for developing and applying to said control circuit a control signal to stop said tuning means when the I-F carrier signal at said first predetermined frequency is the desired carrier for this frequency.

4. A signal seeking system for tuning television receivers of the type including tuning means for scanning the frequency spectrum and selecting any one of a plurality of television signals and converting the modulated picture and sound carrier signal of said television signal to correspondingly modulated picture and sound intermediate frequency signals, and an intermediate frequency amplifier coupled to said tuning means and having a predetermined bandpass characteristic, said receiver being correctly tuned when said picture and sound carrier signals are respectively converted to intermediate frequency signals of a first predetermined frequency and a second predetermined frequency both lying within said bandpass characteristic, comprising in combination:

driving means coupled to drive said tuning means to scan through the said frequency spectrum;

control circuit means coupled to deenergize said driving means to stop said tuning means when said control circuit means are actuated by a control signal;

first circuit means coupled to said intermediate frequency amplifier for sensing when one of said picture and sound R-F carrier signals is at one of said predetermined frequencies;

modulation detecting means for determining the type of modulation in said one I-F carrier signal;

second circuit means for determining the direction of scanning in frequency of said one I-F carrier signal;

means coupling said first and second circuit means and said modulation detecting means to said control circuit means to produce a control signal to actuate said control circuit means when the type of modulation in said I-F carrier signal is indicative of the desired type of modulation for said one predetermined frequency and the direction in which said one I-F carrier is scanned is the proper direction to reject image signals.

5. A signal seeking system for tuning television receivers of the type including tuning means for scanning the frequency spectrum and selecting any one of a plurality of television signals and converting the modulated picture and sound carrier signal of said television signal to correspondingly modulated picture and sound intermediate frequency signals, and an intermediate frequency amplifier coupled to said tuning means and having a predetermined bandpass characteristic, said receiver being correctly tuned when said picture and sound carrier signals are respectively converted to intermediate frequency signals of a first predetermined frequency and a second lower predetermined frequency, both lying within said bandpass characteristic, comprising in combination:

driving means coupled to drive said tuning means to scan through the said frequency spectrum;

control circuit means coupled to deenergize said driving means to stop said tuning means when actuated by a control signal;

first circuit means coupled to said intermediate frequency amplifier for sensing when one of said picture and sound I-F carrier signals is at one of said predetermined frequencies;

modulation detecting means for determining the type of modulation in said one I-F carrier signal;

second circuit means coupled to said intermediate frequency amplifier for determining whether the frequency of the other of said picture and sound I-F carrier signals is higher or lower than the frequency of said one I-F carrier signal;

means coupling said first and second circuit means and said modulation detecting means to said control circuit means to produce a control signal to actuate said control circuit means when said picture and sound I-F carrier signals are at said first and second predetermined frequencies respectively.

6. An automatic tuning system for tuning television receivers of the type including tuning means for scanning the frequency spectrum and selecting any one of a plurality of television signals and converting the modulated picture and sound carriers in said television signal to correspondingly modulated picture and sound intermediate frequency signals, and an intermediate frequency amplifier having a predetermined bandpass characteristic coupled to said tuning means, said receiver being correctly tuned when said picture and sound carrier signals are respectively converted to intermediate frequency signals of a first predetermined frequency and a second lower predetermined frequency both lying within said bandpass characteristic, comprising in combination:

driving means coupled to drive said tuning means to scan through the said frequency spectrum, control circuit means coupled to deenergize said driving means to stop said tuning means when actuated by a control signal, first signal sensing circuit means coupled to said intermediate frequency amplifier for detecting when one of said picture and sound signals has been converted to one of said predetermined frequencies, second signal sensing circuit means coupled to said intermediate frequency amplifier for developing a control voltage when the other of said carrier signals has been simultaneously converted to the other of said predetermined frequencies, gate circuit means including an active element having input, output, and control electrodes, means for biasing said control electrode to render said active element non-conductive, means coupling said first signal sensing circuit means to said input electrode, means coupling said second signal sensing circuit means to said control electrode to cause said control voltage to render said active element conductive to pass I-F carrier signals of said one predetermined frequency, modulation detecting circuit means coupled to said output electrode for developing a control signal when the type of modulation in said one intermediate frequency carrier signal is indicative of the desired type of modulation for signals at said one predetermined frequency, means for applying said control signal to actuate said control circuit means to stop said tuning means.

7. A signal seeking system in accordance with claim 6 wherein said first signal sensing circuit means comprises a resonant circuit sharply tuned to said first predetermined frequency.

8. A signal seeking system in accordance with claim 6 wherein said first signal sensing circuit means comprises a resonant circuit sharply tuned to said first predetermined frequency and said second signal sensing circuit comprises a resonant circuit sharply tuned to said second predetermined frequency.

9. A signal seeking system in accordance with claim 6 wherein said first signal sensing circuit means comprises a resonant circuit sharply tuned to said first predetermined frequency and said second signal sensing circuit means comprises a resistance-capacitance integrating circuit coupled to said intermediate frequency amplifier through a video amplifier and a video detector.

10. A signal seeking system in accordance with claim 6 wherein said first signal sensing means comprises a resonant circuit sharply tuned to said picture intermediate frequency carrier signal and said modulation detecting means comprises a resonant circuit tuned to the frequency of the synchronizing signal amplitude modulation in said picture intermediate frequency carrier signal.

11. A signal seeking system for tuning a television receiver to a desired television signal and rejecting its image, said television signal including a picture carrier and a sound carrier with the picture carrier being transmitted at a lower frequency than the sound carrier and containing synchronizing signal modulation, said receiver including tuning means for scanning the frequency spectrum and selecting any one of a plurality of television signals and converting the modulated picture and sound carriers of said signal to correspondingly modulated picture and sound intermediate frequency carrier signals, said receiver being correctly tuned when said picture and sound carrier signals are respectively converted to intermediate frequency signals of a first predetermined frequency and a second lower predetermined frequency, said receiver including an intermediate frequency amplifier coupled to the tuning means for amplifying said intermediate frequency signals, said intermediate frequency amplifier having a bandpass characteristic in which said first and second predetermined frequencies are respectively located at the upper and lower frequency extremities thereof when correctly tuned, a detector coupled to said amplifier for detecting said intermediate frequency signals, and a video amplifier for amplifying said detected signal, comprising the combination of:

driving means coupled to drive said tuning means to scan through the said frequency spectrum, control circuit means coupled to deenergize said driving means to stop said tuning means when said control circuit means are actuated by a control signal, a first resonant circuit coupled to said intermediate frequency amplifier and tuned to intermediate frequency signals at said first predetermined frequency, gate circuit means including an active element having input, output, control and common electrodes, a synchronizing signal amplitude separator coupling said first resonant circuit to the input electrode of said active element, means for biasing said control electrode with respect to said common electrode to render said active element non-conductive, second signal sensing circuit means coupling said video amplifier to said control electrode for developing a control voltage for rendering said active element conductive, said second signal sensing circuit including a resistance-capacitance integrating circuit which develops a control voltage of a sufficient magnitude to bias said active element to conduction only when one of said intermediate frequency signals traverses a substantial portion of said intermediate frequency amplifier bandpass characteristic, a modulation detecting circuit coupled to said output electrode and including a resonant circuit tuned to select the synchronizing signal modulation contained in said picture intermediate frequency signal when converted to said first predetermined frequency and passed by said gate circuit means; and rectifier means coupled to said modulation detecting circuit to develop said control signal to deenergize said driving device and stop said tuning means.

12. A signal seeking system for tuning television receivers of the type including tuning means for scanning the frequency spectrum and selecting any one of a plurality of television signals and converting the modulated picture and sound carrier signals of a selected television signal to correspondingly modulated picture and sound intermediate frequency signals, and an intermediate frequency amplifier coupled to said tuning means and having a predetermined bandpass characteristic, said receiver being correctly tuned when said picture and sound carrier signals are respectively converted to intermediate frequency signals of first and second predetermined frequencies within said bandpass characteristic, comprising in combination:

driving means coupled to drive said tuning means to scan through said frequency spectrum;

means for energizing said driving means to cause said tuning means to scan said frequency spectrum, control circuit means responsive to a control voltage to de-energize said driving means to stop said tuning means when a received television signal is selected and the picture and sound carrier signals thereof are converted to intermediate frequency signals of said first and second predetermined frequencies respectively;

first circuit means for sensing when both said picture and sound intermediate frequency carrier signals fall within said bandpass characteristic;

second circuit means for identifying the particular intermediate frequency carrier signal at one of said predetermined frequencies in said bandpass characteristic;

means coupling said first and second circuit means to said control means so that when said picture and sound intermediate frequency carrier signals both fall within the bandpass characteristic and the desired one of said intermediate frequency carrier signals is in said one predetermined frequency, said control circuit means is operative to de-energize said driving means.

References Cited in the file of this patent

UNITED STATES PATENTS

| | | |
|---|---|---|
| 2,890,274 | Guyton | June 9, 1959 |
| 2,898,400 | Parmet | Aug. 4, 1959 |